(12) United States Patent
Matz et al.

(10) Patent No.: US 7,682,989 B2
(45) Date of Patent: Mar. 23, 2010

(54) FORMATION OF A SILICON OXIDE INTERFACE LAYER DURING SILICON CARBIDE ETCH STOP DEPOSITION TO PROMOTE BETTER DIELECTRIC STACK ADHESION

(75) Inventors: Laura M. Matz, Murphy, TX (US); Ting Y. Tsui, Markham (CA); Thad E. Briggs, Dallas, TX (US); Robert Kraft, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 390 days.

(21) Appl. No.: 11/750,669

(22) Filed: May 18, 2007

(65) Prior Publication Data

US 2008/0283975 A1    Nov. 20, 2008

(51) Int. Cl.
*H01L 21/31* (2006.01)
*H01L 21/469* (2006.01)
(52) U.S. Cl. .............................. 438/778; 257/E21.267; 257/E21.271; 438/786; 438/787
(58) Field of Classification Search .......... 257/E21.267, 257/E21.271; 438/778, 786, 787
See application file for complete search history.

(56) References Cited

U.S. PATENT DOCUMENTS 6,649,512 B1 * 11/2003 Lee et al. .................... 438/623
7,030,041 B2    4/2006 Li et al.
2001/0033026 A1   10/2001 Nakata et al.
2003/0001273 A1    1/2003 Steiner et al.
2005/0260347 A1 * 11/2005 Narwankar et al. ...... 427/248.1

FOREIGN PATENT DOCUMENTS

JP    2001168188    6/2001

* cited by examiner

*Primary Examiner*—Asok K Sarkar
(74) *Attorney, Agent, or Firm*—Jacqueline J. Garner; Wade J. Brady, III; Frederick J. Telecky, Jr.

(57) ABSTRACT

In accordance with the present teachings, semiconductor devices and methods of making semiconductor devices and dielectric stack in an integrated circuit are provided. The method of forming a dielectric stack in an integrated circuit can include providing a semiconductor structure including one or more copper interconnects and forming an etch stop layer over the semiconductor structure in a first processing chamber. The method can also include forming a thin silicon oxide layer over the etch stop layer in the first processing chamber and forming an ultra low-k dielectric layer over the thin silicon oxide layer in a second processing chamber, wherein forming the thin silicon oxide layer improves adhesion between the etch stop layer and the ultra low-k dielectric as compared to a dielectric stack that is devoid of the thin silicon oxide layer between the etch stop layer and the ultra low-k dielectric.

14 Claims, 4 Drawing Sheets

FORMATION OF A SILICON OXIDE INTERFACE LAYER DURING SILICON CARBIDE ETCH STOP DEPOSITION TO PROMOTE BETTER DIELECTRIC STACK ADHESION

DESCRIPTION OF THE INVENTION

1. Field of the Invention

The subject matter of this invention relates to methods of fabricating semiconductor devices. More particularly, the subject matter of this invention relates to the methods of improving dielectric stack adhesion by use of a silicon oxide interface layer.

2. Background of the Invention

With the decrease in the size of integrated circuits, the need for copper and low k materials in the next generation interconnect structures is well recognized. Copper interconnect back-end-of line (BEOL) processing of silicon integrated circuits utilizes either single damascene or dual damascene processing. In damascene processing, metal is inlaid into patterned dielectric layers and chemical mechanical polishing (CMP) processes are used instead of metal etching. In damascene processes, generally, a barrier/hard mask/etch stop layer is stacked on top of the preceding interconnect copper layer to prevent copper diffusion into the surrounding low k dielectric. Oxygen and/or nitrogen doped silicon carbide is commonly used as an etch stop layer. However, dielectric delamination occurs at the silicon carbide etch stop interface to the porous ultra low k (ULK) dielectric layer, causing electrical shorting due to copper migration through the interface. A current solution to this problem is to create an interface layer during the ULK deposition. This approach has shown some promise but is difficult to control. It causes plasma instability resulting in higher defectivity and other manufacturability issues. Another solution to this problem is to use pretreatments to the oxygen and/or nitrogen doped silicon carbide layer, such as Helium (He) plasma treatment. However, this technique is not effective and is dependent on the silicon carbide properties/composition.

Thus, there is a need to overcome these and other problems of the prior art and to provide methods of improving etch stop adhesion to ULK dielectric layer by forming a silicon oxide interface layer.

SUMMARY OF THE INVENTION

In accordance with the present teachings, there is a method of forming a dielectric stack in an integrated circuit including providing a semiconductor structure including one or more copper interconnects and forming an etch stop layer over the semiconductor structure in a first processing chamber. The method can also include forming a thin silicon oxide layer over the etch stop layer in the first processing chamber and forming an ultra low-k dielectric layer over the thin silicon oxide layer in a second processing chamber, wherein forming the thin silicon oxide layer improves adhesion between the etch stop layer and the ultra low-k dielectric as compared to a dielectric stack that is devoid of the thin silicon oxide layer between the etch stop layer and the ultra low-k dielectric.

According to another embodiment of the present teachings, there is a method of making a semiconductor device. The method can include forming a semiconductor structure including one or more copper interconnects and forming an etch stop layer over the semiconductor structure in a first processing chamber. The method can also include forming a thin silicon oxide layer over the etch stop layer in the first processing chamber and forming a dielectric layer over the thin silicon oxide layer in a second processing chamber.

According to yet another embodiment of the present teachings, there is a semiconductor device including a semiconductor structure including one or more copper interconnects and a dielectric stack including an etch stop layer over the semiconductor structure, a thin silicon oxide layer over the etch stop layer, and an ultra low-k dielectric layer over the thin silicon oxide layer, wherein the etch stop layer and the thin silicon oxide layer are formed in a first processing chamber and the ultra low-k dielectric layer is formed in a second processing chamber, and wherein the dielectric stack exhibits improved adhesion between the etch stop layer and the ultra low-k dielectric as compared to a dielectric stack that is devoid of the thin silicon oxide layer between the etch stop layer and the ultra low-k dielectric.

Additional advantages of the embodiments will be set forth in part in the description which follows, and in part will be obvious from the description, or may be learned by practice of the invention. The advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and together with the description, serve to explain the principles of the invention.

DESCRIPTION OF THE EMBODIMENTS

Reference will now be made in detail to the exemplary embodiments, examples of which are illustrated in the accompanying drawings. Wherever possible, the same reference numbers will be used throughout the drawings to refer to the same or like parts.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. −1, −2, −3, −10, −20, −30, etc.

The term "interconnect" is used interchangeably herein with terms including interconnect line, metal lines, trace, wire, conductor, signal path, and signaling medium. Interconnects are generally made of aluminum, copper, or an alloy of copper and aluminum. Interconnects are conductors that provide signal paths for coupling or interconnecting electrical circuitry. Conductors other than the above mentioned metals include, for example, doped polysilicon, doped single crystal silicon, titanium, molybdenum, tungsten, and refractory metal silicides. The term "oxygen doped silicon carbide" is used interchangeably herein with the term silicon oxy-carbide.

Figure 1A:
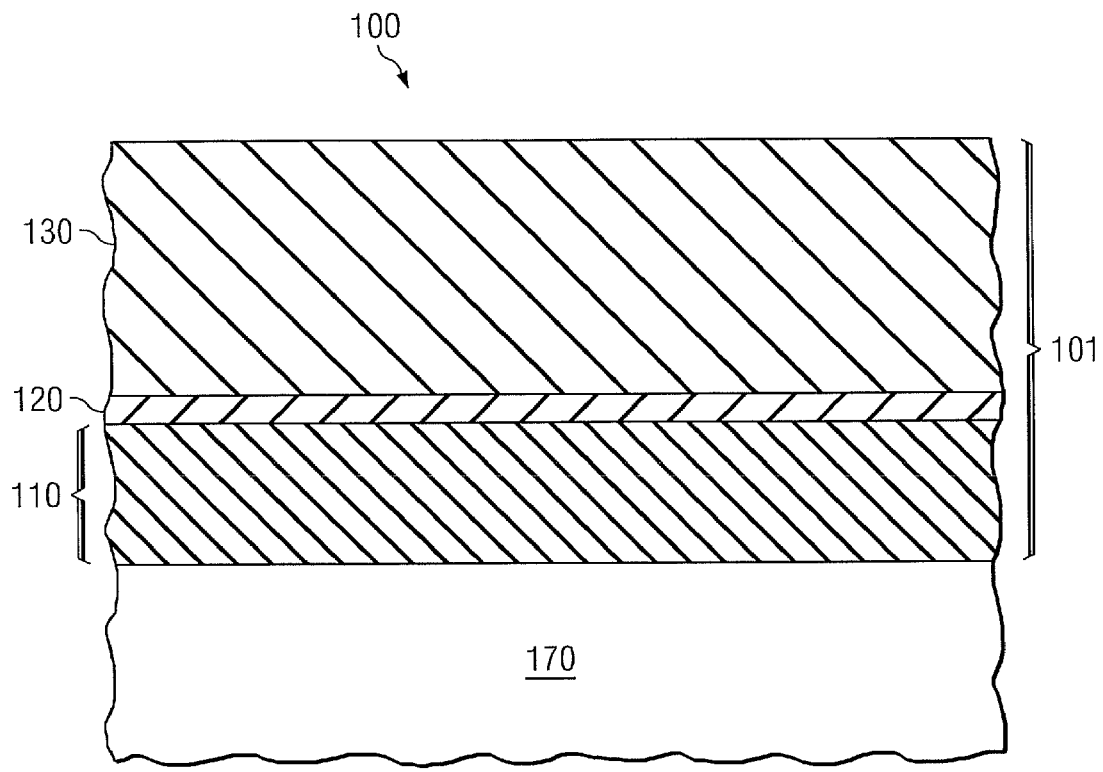
FIGS. 1A and 1B are schematic illustrations of an exemplary dielectric stack in a semiconductor device in accordance with various embodiments of the present teachings.
Figure 1B:
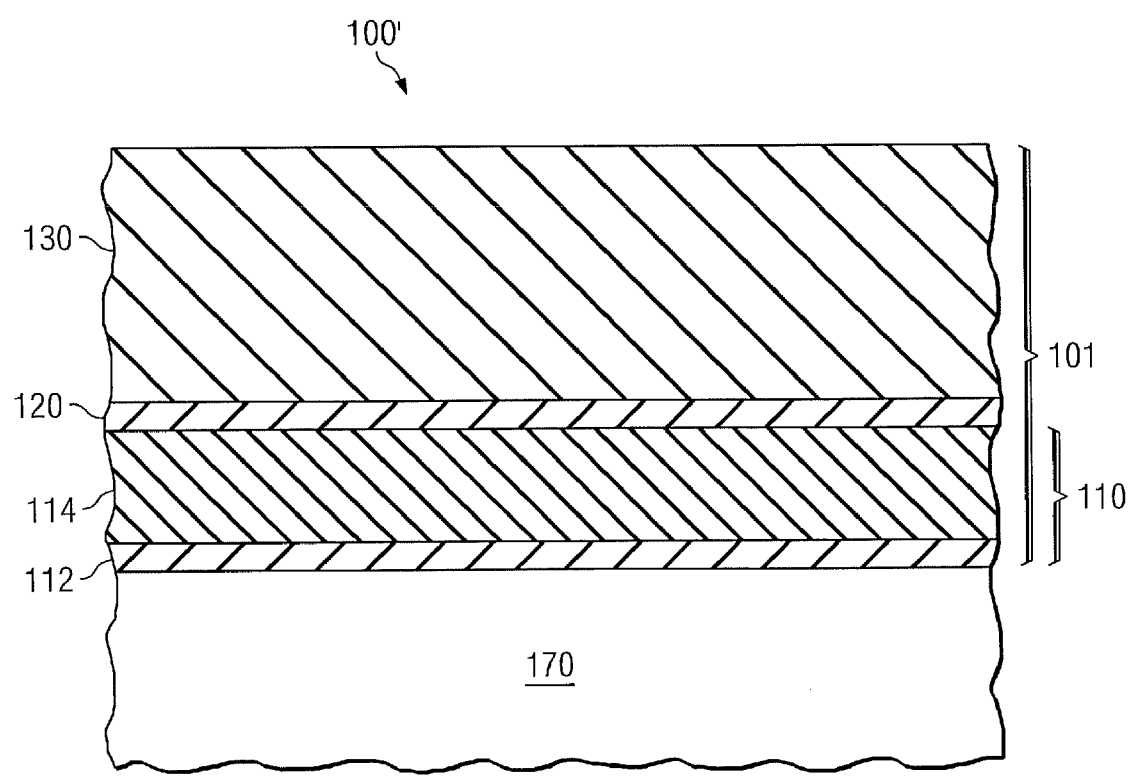

FIGS. 1A and 1B are schematic illustrations of an exemplary dielectric stack 101 in a semiconductor device 100, 100' according to the present teachings. The semiconductor device 100, as shown in FIG. 1A can include a semiconductor structure 170 including one or more copper interconnects (not shown) and a dielectric stack 101 including an etch stop layer 110 over the semiconductor structure 170, a thin silicon oxide layer 120 over the etch stop layer 110, and an ultra low-k dielectric layer 130 over the thin silicon oxide layer 120, wherein the dielectric stack 101 can exhibit improved adhesion between the etch stop layer 110 and the ultra low-k dielectric 130 as compared to a dielectric stack that is devoid of the thin silicon oxide layer 120 between the etch stop layer 110 and the ultra low-k dielectric 130. In various embodiments, the etch stop layer 110 and the thin silicon oxide layer can be formed in a first processing chamber (not shown). In other embodiments, the ultra low-k dielectric layer 130 can be formed in a second processing chamber (not shown). In some embodiments, the etch stop layer 110 can include a layer of oxygen doped silicon carbide. In other embodiments, the etch stop layer 110 can include a layer of nitrogen doped silicon carbide. Yet, in some other embodiments, the etch stop layer 110 can include a first etch stop layer 112 including a layer of silicon nitride over the semiconductor structure 170 and a second etch stop layer 114 including one or more of an oxygen doped silicon carbide layer and a nitrogen doped silicon carbide layer over the first etch stop layer 112, as shown in FIG. 1B. In various embodiments, the ultra low-k dielectric layer 130 can include one or more of an organo silicate glass and a fluorine-doped silicate glass.

One of ordinary skill in the art will understand that the silicon oxide refers to a composition of the type $Si_xO_y$, the oxygen doped silicon carbide refers to a composition of the type $Si_wO_xC_yH_z$, the nitrogen doped silicon carbide refers to a composition of the type $Si_wN_xC_yH_z$, and the silicon nitride refers to a composition of the type $Si_xN_yH_z$, in both stoichiometric and solid solution ratio. According to various embodiments, copper in the semiconductor structure can be copper or an alloy of copper.

In various embodiments, the etch stop layer 110 can have a thickness from about 50 Å to about 600 Å and the thin silicon oxide layer 120 can have a thickness from about 30 Å to about 120 Å. In some embodiments, the etch stop layer 110 can have a thickness from about 100 Å to about 500 Å and the thin silicon oxide layer 120 can have a thickness from about 50 Å to about 100 Å. In various embodiments, the first etch stop layer 112 including a layer of silicon nitride can have a thickness from about 10 Å to about 500 Å and the second etch stop layer including one or more of an oxygen doped silicon carbide layer and a nitrogen doped silicon carbide layer can have a thickness from about 50 Å to about 600 Å.

In various embodiments, the dielectric constant, k of the thin silicon oxide layer 120 can be in the range of about 3.0 to about 4.5, the oxygen doped silicon carbide can be in the range of about 3.5 to about 5.0, the nitrogen doped silicon carbide can be in the range of about 4.5 to about 5.5, and the silicon nitride can be in the range of about 6.0 to about 7.0. The actual dielectric constant of the silicon oxide layer, oxygen and/or nitrogen doped silicon carbide layer, and the silicon nitride layer depend on the deposition process parameters.

Figure 2A:
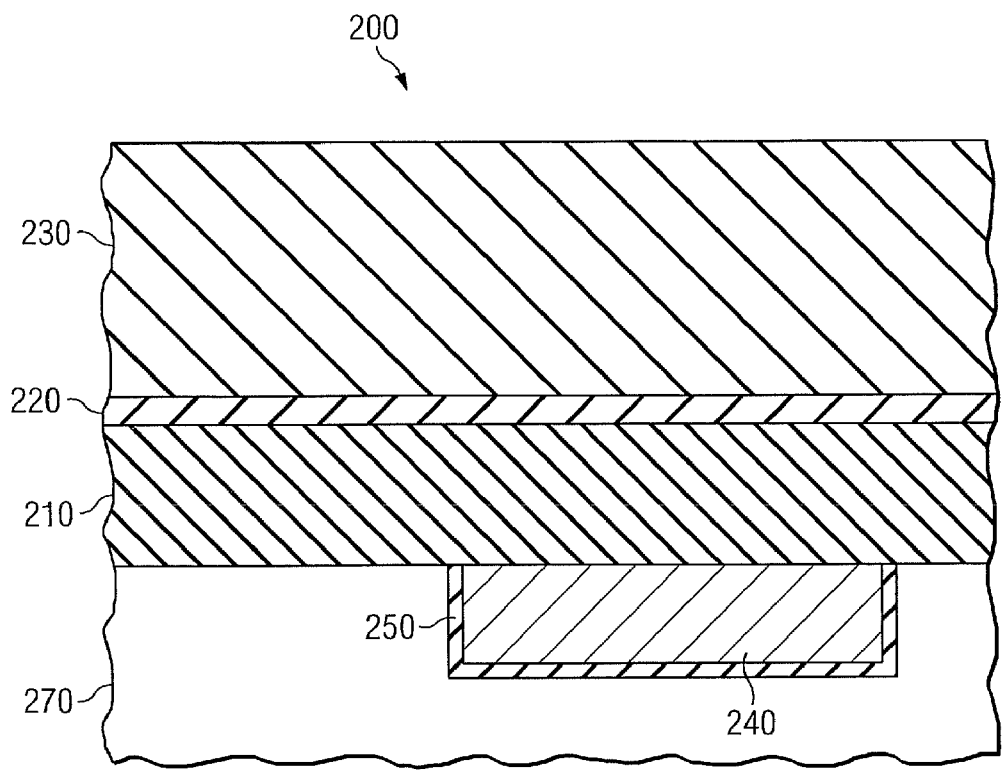
FIGS. 2A-2D depict schematic illustrations of an exemplary method for fabricating a semiconductor device according to various embodiments of the present invention.

FIGS. 2A-2D depict schematic illustrations of an exemplary method of making a semiconductor device 200 according to various embodiments of the present teachings. The method can include forming a semiconductor structure 270 including one or more copper interconnects 240. In some embodiments, the method can include forming a semiconductor structure 270 including one or more copper interconnects 240 and forming a metal barrier layer 250 on the bottom and sidewalls of the copper interconnect 240 as shown in FIG. 2A. The method of making a semiconductor device 200 can further include forming an etch stop layer 210 over the semiconductor structure 270 in a first processing chamber (not shown) and forming a thin silicon oxide layer 220 over the etch stop layer 210 in the first processing chamber (not shown), as shown in FIG. 2A. The method can also include forming a dielectric layer 230 over the thin silicon oxide layer 220 in a second processing chamber (not shown), as shown in FIG. 2A.

In certain embodiments, the step of forming an etch stop layer 210 over the semiconductor structure 270 in a first processing chamber (not shown) can include depositing a layer of oxygen doped silicon carbide over the semiconductor structure 270. In some embodiments, the step of forming an etch stop layer 210 over the semiconductor structure 270 in a first processing chamber (not shown) can include depositing a layer of nitrogen doped silicon carbide over the semiconductor structure 270. Yet in some other embodiments, the step of forming an etch stop layer 210 over the semiconductor structure 270 in the first processing chamber can include forming a first etch stop layer including silicon nitride over the semiconductor structure 270 and forming a second etch stop layer including one or more of an oxygen doped silicon carbide layer and a nitrogen doped silicon carbide over the first etch stop layer.

One of ordinary skill in the art would know that there are various methods for the deposition of oxygen doped silicon carbide including, but not limiting to chemical vapor deposition (CVD), low pressure chemical vapor deposition (LPCVD), plasma enhanced chemical vapor deposition (PECVD), and atomic layer deposition (ALD). While not intending to be bound by any specific deposition method, in certain embodiments, a mixture of gases including but not limiting to carbon dioxide, hydrogen, helium, oxygen, nitrous oxide, tri-methyl silane (TMS), and silane can be used in a first processing chamber or a first reactor. The flow rate of carbon dioxide, hydrogen, oxygen, nitrous oxide, tri-methyl silane, and silane can be in the range of about 50 sccm to about 5000 sccm. The flow rate of helium can be in the range of about 100 sccm to about 10000 sccm. The oxygen doped silicon carbide can be deposited at a reactor operating temperature in the range of about 300° C. to about 400° C. and reactor pressure in the range of about 2.0 Torr to about 10 Torr. The power range for oxygen doped silicon carbide deposition can be from about 100 W to about 1000 W and low frequency RF power can be from about 50 W to about 400 W.

One of ordinary skill in the art would know that there are various methods for the deposition of nitrogen doped silicon carbide including, but not limiting to CVD, LPCVD, PECVD, and ALD. While not intending to be bound by any specific deposition method, in certain embodiments, a mixture of gases including but not limiting to carbon dioxide, hydrogen, helium, oxygen, ammonia, tri-methyl silane (TMS), and silane can be used in the first processing chamber or the first reactor, also used for the deposition of oxygen doped silicon carbide. The flow rate of carbon dioxide, hydrogen, oxygen, ammonia, tri-methyl silane (TMS), and silane can be in the range of about 50 sccm to about 5000 sccm. The flow rate of helium can be in the range of about 100 sccm to about 10000 sccm. The nitrogen doped silicon carbide can be deposited at a reactor operating temperature in the range of about 300° C. to about 400° C. and reactor pressure in the range of about 2.0 Torr to about 10 Torr. The power range for nitrogen doped silicon carbide deposition can be from about 100 W to about 1000 W and low frequency RF power can be from about 50 W to about 400 W.

Thin layer of silicon oxide can be deposited by any suitable deposition process including, but not limiting to, CVD, LPCVD, PECVD, and ALD. While not intending to be bound by any specific deposition method, in certain embodiments, a mixture of gases including but not limiting to helium, oxygen, nitrous oxide, and silane can be used in the first processing chamber or the first reactor, also used for the deposition of oxygen and/or nitrogen doped silicon carbide. The flow rate of oxygen, nitrous oxide, and silane can be in the range of about 50 sccm to about 5000 sccm. The flow rate of helium can be in the range of about 100 sccm to about 10000 sccm. The silicon oxide can be deposited at a reactor operating temperature in the range of about 300° C. to about 400° C. and reactor pressure in the range of about 2.0 Torr to about 10 Torr. The power range for silicon oxide deposition can be from about 100 W to about 1000 W and low frequency RF power can be from about 50 W to about 400 W.

One of ordinary skill in the art would know that there are various techniques for the deposition of silicon nitride including, but not limiting to CVD, LPCVD, PECVD, glow discharge, thermo catalytic (or hot wire) CVD, and atomic layer deposition (ALD). While not intending to be bound by any specific deposition method, in some embodiments, a mixture of gases such as silane, ammonia, and nitrous oxide can be used for the deposition of silicon nitride in the first processing chamber or the first reactor, also used for the deposition of thin silicon oxide layer and oxygen and/or nitrogen doped silicon carbide. The silane flow rate can be in the range of about 50 sccm to about 500 sccm. The ammonia flow rate can be in the range of about 500 sccm to about 7000 sccm and nitrous oxide flow rate can be in the range of about 500 sccm to about 3000 sccm. The operating pressure of the reactor can be from about 3 Torr to about 12 Torr. The silicon nitride can be deposited at a reactor operating temperature ranging from about 300° C. to about 400° C. and typically high frequency RF power can range from about 0 to about 1000 W.

In some embodiments, the step of forming a dielectric layer 230 over the thin silicon oxide layer can include depositing an ultra low-k dielectric layer over the thin silicon oxide layer. In certain embodiments, depositing an ultra low-k dielectric layer can include depositing one or more of an organo-silicate glass and a fluorine-doped silicate glass.

Figure 2B:
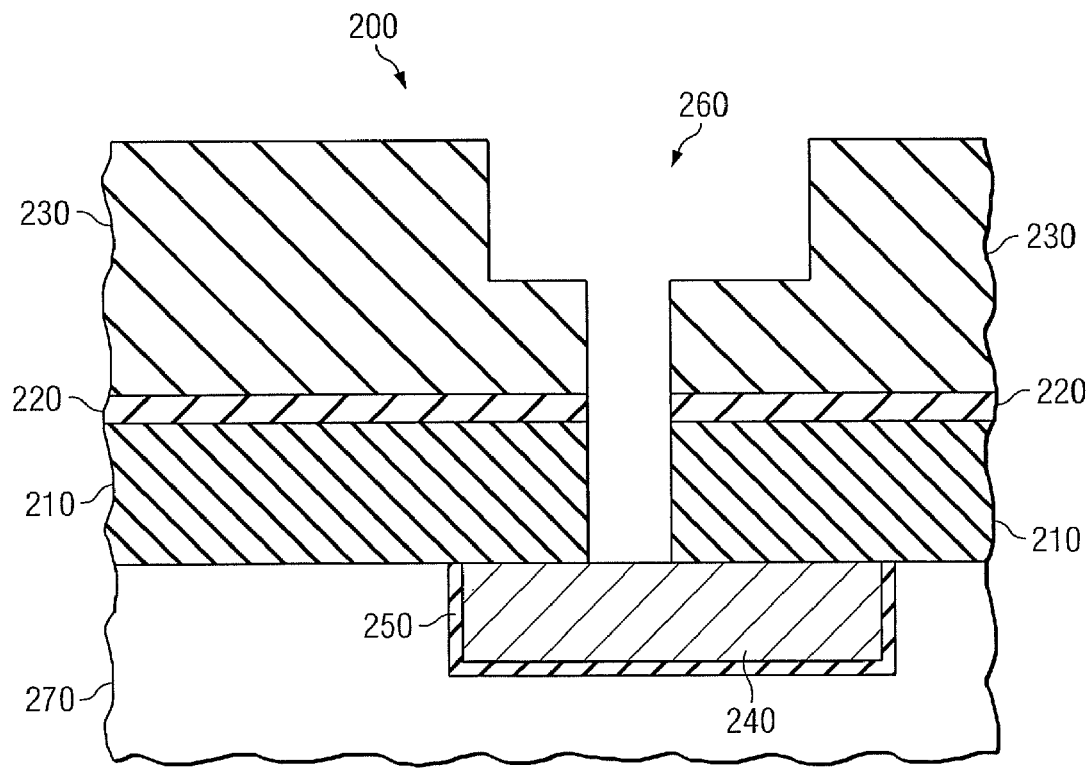
Figure 2C:
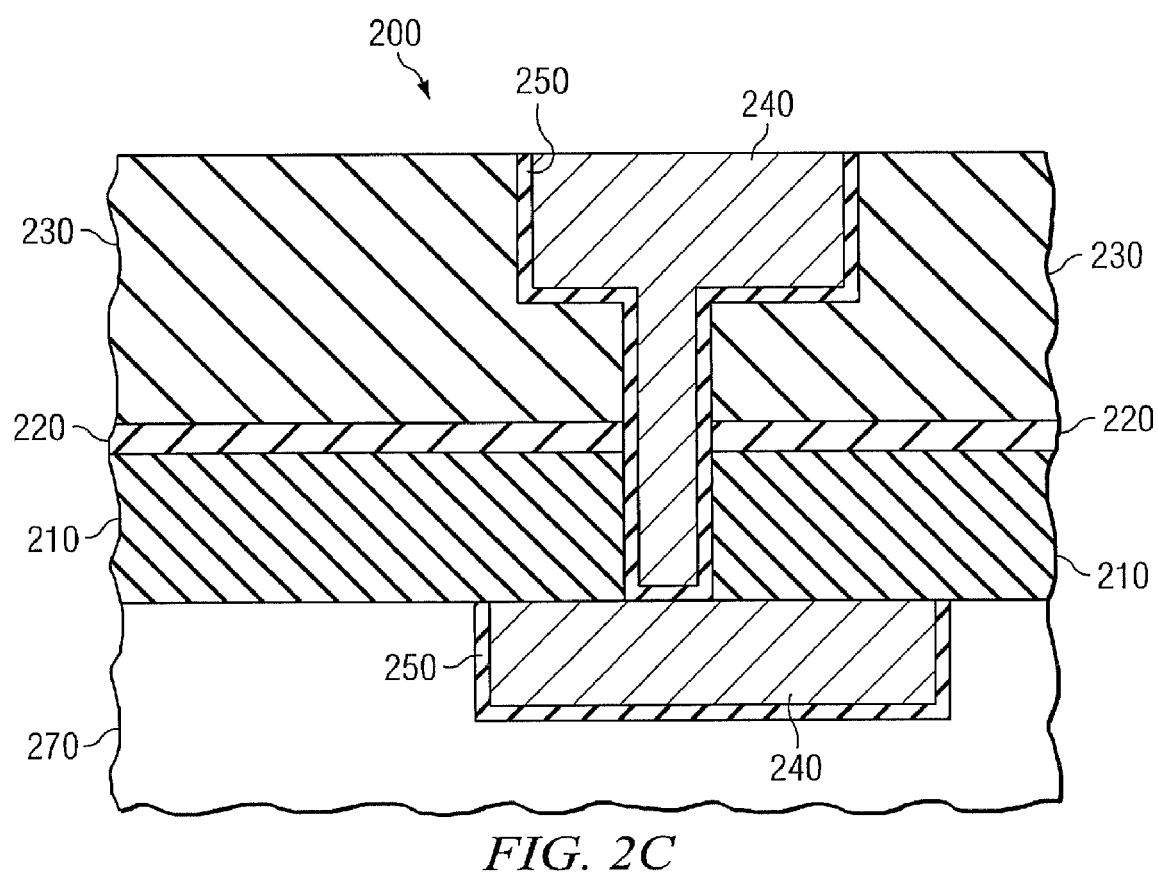

Turning back to the method of making a semiconductor device 200, the method can further include forming a damascene opening 260 to expose the underlying copper interconnect 240 as shown in FIG. 2B. One of ordinary skill in the art will understand that the damascene opening can be formed by etching, including but not limited to, chemical, plasma, physical (ion milling), and reactive ion etching. The method can also include depositing a layer of metal barrier 250 on the bottom and the sidewalls of the damascene opening 260 and filling the damascene opening 260 with copper or copper alloy 240 over the metal barrier layer 250 as shown in FIG. 2C. Copper filling can be done by electrochemical plating, electroless plating, or chemical vapor deposition. One of ordinary skill in the art will understand that the copper fill can be accompanied by planarization such as chemical mechanical polishing to remove excess copper or copper alloy from the dielectric layer 230.

Figure 2D:
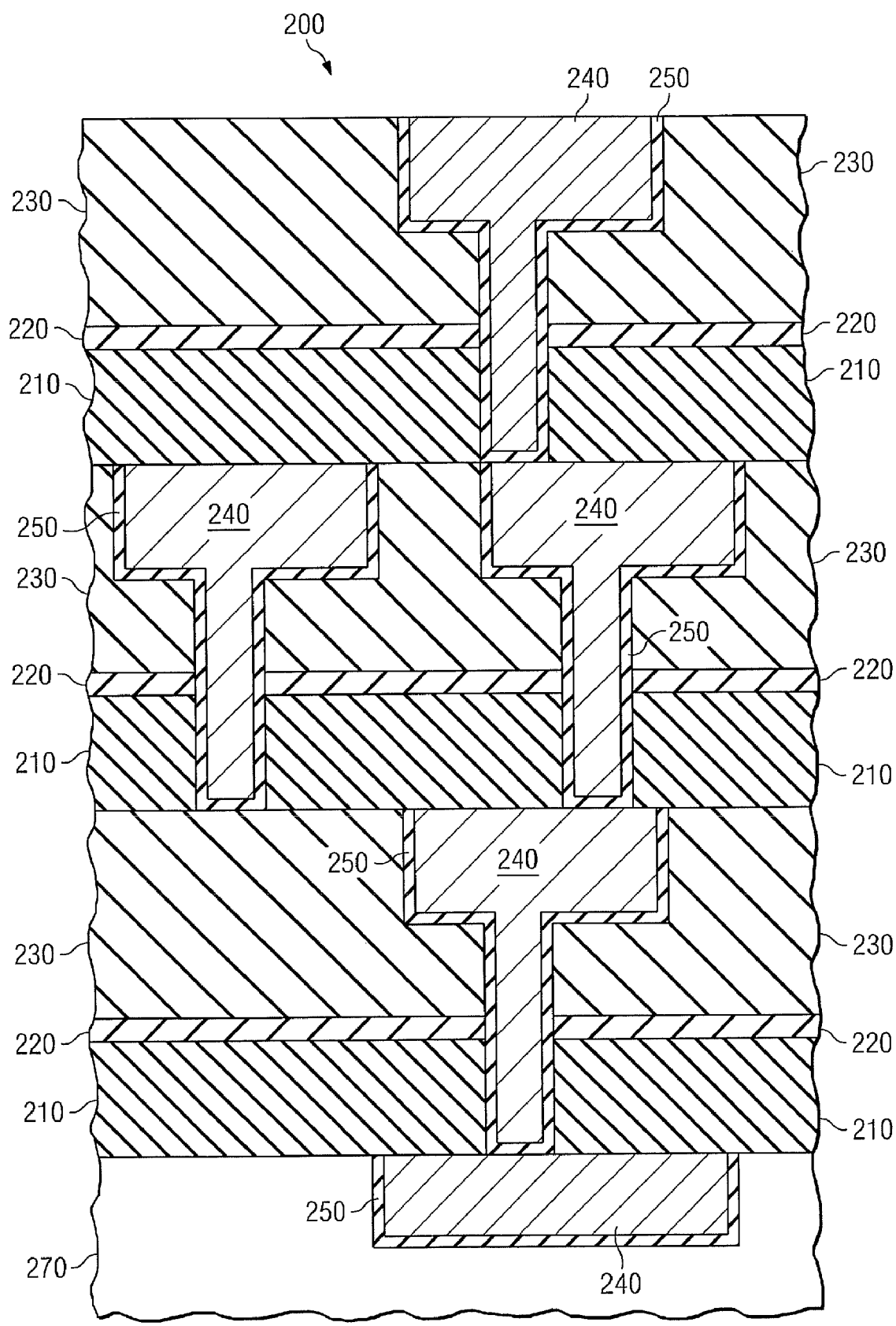

In various embodiments, the method of making a semiconductor device 200 can further include forming an etch stop layer 210 over the dielectric layer 230, forming a thin silicon oxide layer 220 over the etch stop layer 210, forming another dielectric layer 230 over the thin silicon oxide layer 220, forming a damascene opening, filling the damascene opening with copper or copper alloy and repeating the process as many times as required as shown in FIG. 2D.

According to various embodiments, there is a method of forming a dielectric stack 101 in an integrated circuit 100. The method can include providing a semiconductor structure 170 including one or more copper interconnects. The method can also include forming an etch stop layer 110 over the semiconductor structure 170 in a first processing chamber and forming a thin silicon oxide layer 120 over the etch stop layer 110 in the first processing chamber. The method of forming a dielectric stack 101 can further include forming an ultra low-k dielectric layer 130 over the thin silicon oxide layer 120 in a second processing chamber.

According to various embodiments, the step of forming the thin silicon oxide layer 120 can improve adhesion between the etch stop layer 110 and the ultra low-k dielectric 130 as compared to a dielectric stack that is devoid of the thin silicon oxide layer 120 between the etch stop layer 110 and the ultra low-k dielectric 130. Furthermore, a small reduction in capacitance can be observed due to the overall reduction in the dielectric constant, K value of the etch stop layer 110. In addition, the plasma reaction to form a thin silicon oxide layer 120 can be more stable when performed in the etch-stop platform, i.e. in the same processing chamber as used for deposition of etch stop layer 110.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising."

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of forming a dielectric stack in an integrated circuit comprising:
   providing a semiconductor structure comprising one or more copper interconnects;
   forming an etch stop layer over the semiconductor structure in a first processing chamber;
   forming a thin silicon oxide layer over the etch stop layer in the first processing chamber; and
   forming an ultra low-k dielectric layer over the thin silicon oxide layer in a second processing chamber,
   wherein forming the thin silicon oxide layer improves adhesion between the etch stop layer and the ultra low-k dielectric as compared to a dielectric stack that is devoid of the thin silicon oxide layer between the etch stop layer and the ultra low-k dielectric.

2. The method of claim 1, wherein the step of forming an etch stop layer comprises depositing a layer of oxygen doped silicon carbide having a dielectric constant between approximately 3.5 to approximately 5.0.

3. The method of claim 1, wherein the step of forming an etch stop layer comprises depositing a layer of nitrogen doped silicon carbide having a dielectric constant between approximately 4.5 to approximately 5.5.

4. The method of claim 1, wherein the step of forming an etch stop layer over a semiconductor structure in a first processing chamber comprises:
   forming a first etch stop layer comprising silicon nitride and having a thickness between approximately 10 angstrom to approximately 100 angstrom over the semiconductor structure; and
   forming a second etch stop layer having a thickness between approximately 100 angstrom and approximately 600 angstrom over the first etch stop layer,
   wherein the second etch stop layer comprises one or more of an oxygen doped silicon carbide layer and a nitrogen doped silicon carbide.

5. The method of claim 1, wherein the step of forming a thin silicon oxide layer over the etch stop layer comprises depositing a thin silicon oxide layer having a thickness between approximately 30 angstrom to approximately 120 angstrom.

6. The method of claim 1, wherein the step of forming a thin silicon oxide layer over the etch stop layer comprises depositing a thin silicon oxide layer having a dielectric constant less than or equal to approximately 4.5.

7. The method of claim 1, wherein the step of forming an ultra low-k dielectric layer over the thin silicon oxide layer comprises forming one or more of an organo silicate glass layer and a fluorine-doped silicate glass layer.

8. A method of making a semiconductor device, the method comprising:
   forming a semiconductor structure comprising one or more copper interconnects;
   forming an etch stop layer over the semiconductor structure in a first processing chamber;
   forming a thin silicon oxide layer over the etch stop layer in the first processing chamber; and
   forming a dielectric layer over the thin silicon oxide layer in a second processing chamber.

9. The method of claim 8, wherein the step of forming an etch stop layer comprises depositing a layer of oxygen doped silicon carbide having a dielectric constant between approximately 3.5 to approximately 5.0.

10. The method of claim 8, wherein the step of forming an etch stop layer comprises depositing a layer of nitrogen doped silicon carbide having a dielectric constant between approximately 4.5 to approximately 5.5.

11. The method of claim 8, wherein the step of forming an etch stop layer over a semiconductor structure comprises:
   forming a first etch stop layer of silicon nitride having a thickness between approximately 10 angstrom to approximately 100 angstrom over a semiconductor structure; and
   forming a second etch stop layer comprising one or more of an oxygen doped silicon carbide layer and a nitrogen doped silicon carbide and having a thickness between approximately 100 angstrom to approximately 600 angstrom over the first etch stop layer.

12. The method of claim 8, wherein the step of forming a thin silicon oxide layer over the etch stop layer comprises depositing a thin silicon oxide layer having a thickness between approximately 30 angstrom to approximately 120 angstrom.

13. The method of claim 8, wherein the step of forming a dielectric layer over the thin silicon oxide layer comprises depositing an ultra low-k dielectric layer.

14. The method of claim 13, wherein depositing an ultra low-k dielectric layer over the thin silicon oxide layer comprises depositing one or more of an organo silicate glass layer and a fluorine-doped silicate glass layer.

* * * * *